United States Patent [19]

Werrbach

[11] Patent Number: 5,334,947
[45] Date of Patent: Aug. 2, 1994

[54] LOGIC ENHANCED NOISE GATE

[75] Inventor: Donn Werrbach, Burbank, Calif.

[73] Assignee: Aphex Systems, Ltd., Sun Valley, Calif.

[21] Appl. No.: 85,728

[22] Filed: Jul. 6, 1993

[51] Int. Cl.⁵ .............................................. H03G 3/32
[52] U.S. Cl. ........................................................ 330/149
[58] Field of Search ................ 330/136, 149; 307/542; 328/165; 381/71, 73.1, 54; 455/296, 303

[56] References Cited

U.S. PATENT DOCUMENTS 3,126,449  3/1964  Shirman ................................ 381/94
5,220,287  6/1993  Astridge ........................... 330/136 X

*Primary Examiner*—James B. Mullins
*Attorney, Agent, or Firm*—Thomas I. Rozsa; Tony D. Chen

[57] ABSTRACT

An apparatus and a method using logical functions to improve the performance of a noise gate. When the input or triggering signal exceeds the gate threshold, a first bistable logic element is set. Simultaneously, a second monostable logic element is triggered for a set time-out. A third logic element determines if the second monostable logic element is reset after the time-out and the triggering signal is below the gate threshold, at which time the first bistable logic element is forced to the reset condition. Under no other condition can the first bistable logic element be reset. The logic output of the first bistable logic element controls the noise gate, causing it to open when set and close when reset. The advantage of this method over prior art is a more decisive gate operation whereby a short transient triggering signal can fully and definitely trigger the gate open.

25 Claims, 5 Drawing Sheets

LOGIC ENHANCED NOISE GATE

BACKGROUND OF THE INVENTION

1. Field of the Invention

The present invention relates to the field of electronic audio equipment. More particularly, the present invention relates to the field of so-called "noise gates" used in the audio industry to reduce background noise when a signal is absent, or for special effects such as "drum gating" used in music recording studios.

2. Description of the Prior Art

A noise gate can most simply be described as being composed of a threshold detector and a signal controller. The signal controller is used to open the signal path whenever the signal is above a threshold, and close the signal path when the signal falls below the threshold. The signal controller could be in the form of a switch which would cause an abrupt gating of the signal.

More commonly, the signal controller is in the form of a variable gain device producing a ramped gain effect for turn-on and turn-off, allowing a "soft switch" effect or user adjustable specialized gating effect. The turn-on ramp time is normally called the "attack time" of a gate, and the turn-off ramp time is normally called the "release time". A "hold" function is also commonly used which has the effect of keeping the signal controller from immediately beginning to ramp down as soon as the signal goes below threshold. In most conventional noise gates, the threshold, attack time, hold time, and release time are operational adjustments.

A prior art noise gate generally operates as follows. The input signal is applied and feeds to a voltage controlled amplifier (VCA) and a comparator. The comparator also receives an input from a variable reference voltage. When the magnitude of the signal peak is below the magnitude of the reference voltage, the comparator output remains at a logic low level. When a signal peak exceeds the reference magnitude, the comparator output goes to a logic high level. In the latter case, the input signal is said to "go above threshold".

To facilitate proper gate triggering, the signal fed to the comparator is normally a full wave rectified and filtered version of the input signal. The rectification gives an absolute value rendition of the input signal, thus allowing peak detection of both positive and negative signal polarities. The filtering smooths out the rectifier pulses, providing the comparator input which follows the input signal average peak envelope. Without a rectifier filter, a prior art noise gate would undesirably open and close upon each signal wave circle rather than upon the input signal's peak envelope magnitude.

The problem with using a rectifier filter is that it adds an appreciable time delay to the comparator for above and below threshold detection. In addition, it can cause filtering out of fast and short transients of the input signal which may be desirable to retain for gate triggering.

An attack/release switch is used in prior art noise gates, and is controlled by the comparator output. When the input signal is below threshold, the switch remains in a "release" position, and the VCA gain is below unity and the output signal is said to be gated off. When the input signal achieves a great enough magnitude to go above threshold, the comparator output causes the attack/release switch to move to an "attack" position, and the VCA gain is equal to unity and the output signal is now said to be gated on.

In some cases it is desirable to cause a first input signal to be gated on or off by the presence of a second related or unrelated signal. In these cases the comparator receives a separate "triggering" signal which may be independent to the input signal. The first input signal is fed to the VCA and is gated on or off, depending on whether the second triggering signal is above or below the threshold.

Referring to FIG. 1, there is shown the operation of a prior art noise gate. The upper curve shows the VCA Gain (G) and the lower curve shows the signal input amplitude (A) relative to the gating threshold (TH). The horizontal axis of the upper and lower curves are the common time (t) axis. In FIG. 2, it is illustrated that when the input signal rises above threshold TH at time Ta, the VCA gain G begins to ramp up toward 0 dB at the attack rate. As the input signal remains above threshold TH until time Tb, the VCA gain G reaches 0 dB and remains there until time Tb when the signal falls below threshold TH.

The problem with this type of prior art noise gate is that, right after time Tb, even though the input signal still has a significant level just below the gate threshold TH, the VCA begins attenuating along the release time slope between time Tb and time Td (at which time the VCA becomes fully attenuated). This obviously can cause undesired attenuation of an important part of the signal.

To solve this problem, a hold time switch is further utilized in some prior art noise gates. The hold time switch is operated under the control of a hold timer. When the comparator output goes from a high to a low logic level, the hold timer begins a time-out period. During this hold time period, the hold time switch remains in a position which allows the VCA gain to remain unity, and therefore keeps the output signal gated on. This will prevent the quick attenuation of the signal right after the input signal falls below the threshold. When the hold time period lapses, the hold time switch switches to the opposite position which causes the drop of the VCA gain, and therefore causes the output signal to be gated off.

Referring to FIG. 2, there is shown the addition of a significant hold time to the gate. The hold time is initiated at time Tb, when the signal falls below threshold TH, and ends at time Tc. The release time in FIG. 3 is made shorter than that of FIG. 2. It can be seen that the hold time combined with a shorter release time will allow more of the signal to pass through the gate before VCA attenuation begins.

However, even with the hold time function added, the prior art noise gates still have a critical limitation, as illustrated in FIG. 3. Referring to FIG. 3, there is shown that the prior art noise gates cannot function properly when the input signal only rises above the threshold for a brief period of time. As can be seen, the signal now stays above threshold TH for too short a time to allow a full attack to 0 dB VCA gain. Although the hold time is initiated at time Tb when the signal falls below threshold TH, the VCA never attained enough gain to pass the signal at the full level. It is very common in the real world for signals, such as a snare drum being played, to at one time cause the gate to fully open, and at another time to act as shown in FIG. 3, not quite gating fully. This causes difficulty in using the noise gate on such signals.

Therefore, it is very desirable to have a new noise gate device which works properly with all kinds of signals and overcomes the problem associated with prior art noise gate devices.

SUMMARY OF THE INVENTION

The present invention is a logic noise gate used in the audio industry for reducing background noise when a signal is absent, or for special effects such as "drum gating" used in music recording studios.

The present invention is an apparatus and a method using logical functions to improve the performance of a noise gate. When an input signal exceeds the gate threshold, a first bistable logic element is set. Simultaneously, a second monostable logic element is triggered for a set time-out. A third logic element determines if the second monostable logic element is reset after the time-out and the input signal is below the gate threshold, at which time the first bistable logic element is forced to the reset condition. Under no other condition can the first bistable logic element be reset. The logic output of the first bistable logic element controls the noise gate, causing it to open when set and close when reset. The advantage of the present invention over prior art is a more decisive gate operation whereby a short transient input signal can fully and definitely trigger the gate open.

It is known that a noise gate device can normally function to block the passage of signal input when the signal input is below a threshold level, and to allow the passage of a signal input when the signal input is above the threshold level. This is performed by an attack-release switch which operates under the attack time and release time parameters.

It is also known that a noise gate device may also operate with a hold time function, which will allow more of the peak signal to pass through the gate before VCA attenuation begins, to prevent the undesired attenuation of an important part of the signal. The hold time period starts at the moment when the signal falls below threshold.

There are some problems with the prior art noise gates when they are used for a variety of input signals. One disadvantage of the prior art noise gate is that a rectifier filter has to be used for smoothing the out the rectifier pulses. One disadvantage of using a rectifier filter is that it adds a considerable time delay to the comparator for above and below threshold detection. Another disadvantage is that the rectifier filter can filter out fast and short transients of the input signal which may be desirable to retain for gate triggering.

An additional disadvantage of the prior art noise gate is that the input signal must remain above the threshold longer than the attack time, or the noise gate cannot fully gate the input signal on, as illustrated in FIG. 3. This disadvantage of prior art noise gates happens when the input signal stays above the threshold for a short period of time which is less than the attack time of the noise gate. The hold time function of the conventional noise gates does not solve this disadvantage of the prior art noise gates. As shown in FIG. 3, although a hold time function is utilized, the VCA never attained enough gain to pass the signal at the full level to start with. This is because in prior art noise gates, the hold time period is initiated only at the instant Tb when the input signal falls below threshold.

This problem of the prior art cannot be solved by setting the attack time very fast to allow gating of fast or transient signals, because undesired clicking sounds will be produced by the abrupt gate turn-on. For instance, if a repetitive sound such as a drum is being gated, the transient drum signal may not consistently trigger the gate and erratic gating called "chatter" can occur.

It has been discovered, according to the present invention, that if a logic circuit arrangement is utilized in a noise gate, where the logic circuit arrangement includes monostable and bistable logical elements such as a logical NOR gate and a logical flip-flop, then the new noise gate can overcome the prior art disadvantage of a lack of gaining a complete attack on brief input signals, while maintaining slow attack time settings to avoid the problem of chatter.

It has also been discovered, according to the present invention, that if the new noise gate utilizes a logic circuit arrangement including monostable and bistable logical elements such as a logical NOR gate and a logical flip-flop, then the threshold comparator can be fed an unfiltered version of the input signal without causing the undesirable single-cycle gating action of a prior art noise gate, while eliminating appreciable time delay and the loss of transients caused by the prior art rectifier filter.

It has been further discovered, according to the present invention, that if the noise gate has a function to initiate the hold time period not at the instant when the input signal falls below the threshold, but at the instant when the input signal rises above the threshold, then the hold time period will allow a very brief input signal to be gated on, even when the input signal only stays above the threshold for a very short period of time which is less than the attack time of the noise gate.

It has been additionally discovered, according to the present invention, that if the noise gate utilizes a logic circuit comprising a group of logical elements, then the function of the attack/release switch and the hold time switch can be combined and the attack/release switch and the hold time switch can be replaced by the logic circuit.

It is therefore an object of the present invention to provide a logic noise gate which utilizes a logic circuit arrangement including monostable and bistable logical elements such as a logical NOR gate and a logical flip-flop, so that the new noise gate can overcome the prior art disadvantages such as the lack of gaining a complete attack on brief input signals, while the new noise gate still maintains slow attack time settings to avoid the problem of chatter.

It is also an object of the present invention to provide a logic noise gate which eliminates the rectifier filter without causing the undesirable single-cycle gating action of prior art noise gates, so that the appreciable time delay and the loss of transients caused by the prior art rectifier filter are eliminated.

It is a further object of the present invention to provide a logic noise gate which has a function to initiate the hold time period not at the instant when the input signal falls below the threshold, but at the instant when the input signal rises above the threshold, so that the hold time period will allow a very brief input signal to be gated on, even when the input signal only stays above the threshold for a very short period of time which is less than the attack time of the noise gate.

It is an additional object of the present invention to provide a logic noise gate which utilizes a logic circuit comprising a group of logic elements, so that the function of the attack/release switch and the hold time switch can be combined and the attack/release switch and the hold time switch can be replaced by the logic circuit.

It is another object of the present invention to provide a logic noise gate which is durable, reliable, energy efficient and low cost.

Described generally, the present invention is an apparatus and a method using logical functions to improve the performance of a noise gate. When the input signal exceeds the gate threshold, a first bistable logic element is set. Simultaneously, a second monostable logic element is triggered for a set time-out. A third logic element determines if the second monostable logic element is reset after the time-out and the input signal is below the gate threshold, at which time the first bistable logic element is forced to the reset condition. Under no other condition can the first bistable logic element be reset. The logic output of the first bistable logic element controls the noise gate, causing it to open when set and close when reset. The advantage of the present invention over prior art is a more instantaneous and decisive gate operation whereby a short transient input signal can fully and definitely trigger the gate open.

The present invention is not limited to the applications in the audio industries and in the music recording business, but could be useful in communications or other fields where a form of signal gating is used. For example, the squelch circuit of 2-way radio receivers can be improved by adaptation of the present invention.

Further novel features and other objects of the present invention will become apparent from the following detailed description, discussion and the appended claims, taken in conjunction with the drawings.

BRIEF DESCRIPTION OF THE DRAWINGS

Referring particularly to the drawings for the purpose of illustration only and not limitation, there is illustrated.

DESCRIPTION OF THE PREFERRED EMBODIMENT

Although specific embodiments of the present invention will now be described with reference to the drawings, it should be understood that such embodiments are by way of example only and merely illustrative of but a small number of the many possible specific embodiments which can represent applications of the principles of the present invention. Various changes and modifications obvious to one skilled in the art to which the present invention pertains are deemed to be within the spirit, scope and contemplation of the present invention as further defined in the appended claims.

Figures 4, 5:
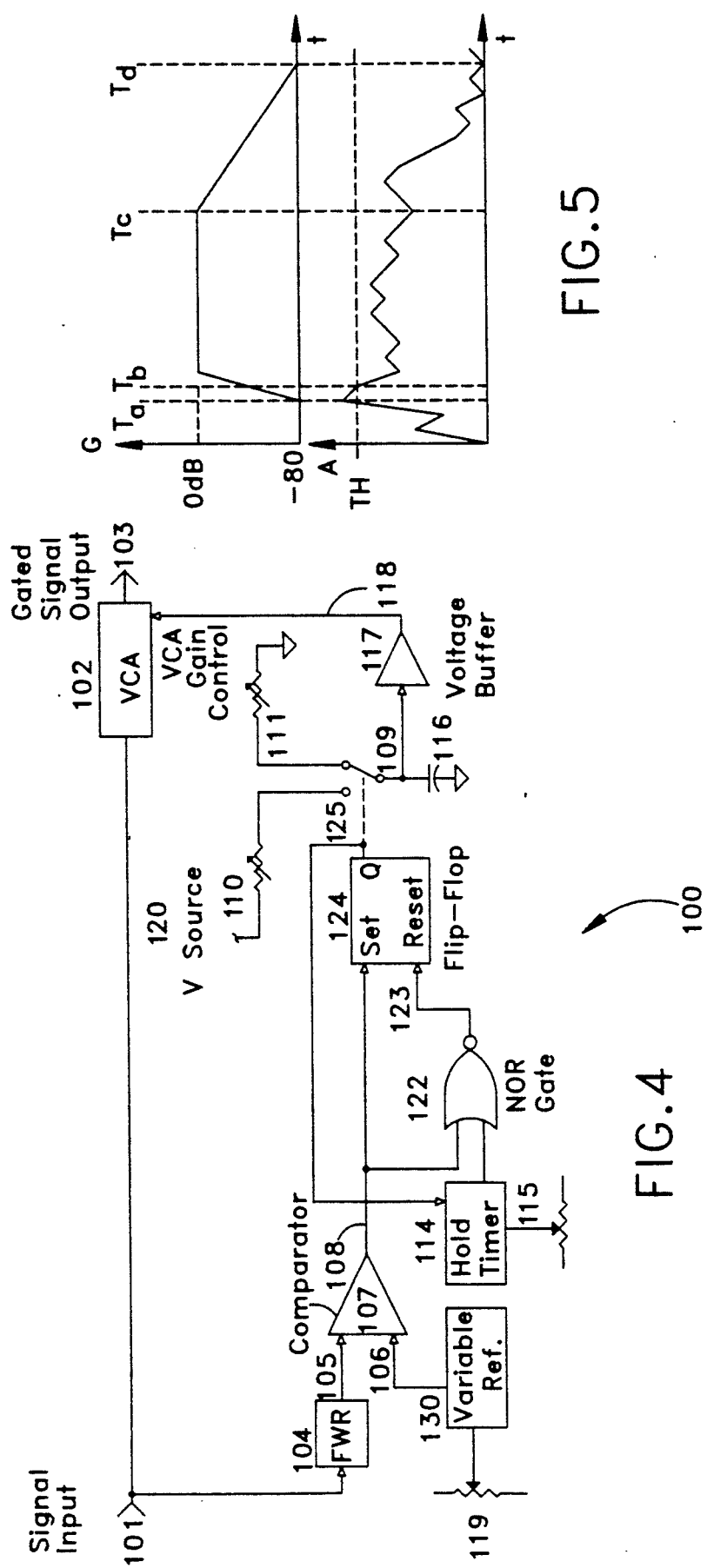
FIG. 4 is a functional block diagram of the present invention noise gate.
FIG. 5 is an illustrative diagram showing the advantage of the present invention noise gate where even a very brief input signal can be fully gated on because the hold time function is initiated at time Ta When the input signal rises above the threshold.

Referring to FIG. 4, there is illustrated a functional block diagram of the present invention. The present invention noise gate 100 operates as follows. The input signal is applied at point 101 and feeds a voltage controlled amplifier (VCA) 102, and a full wave rectifier (FWR) 104. The VCA output 103 is the gated output signal. A comparator 107 receives an input from the FWR 104 and a variable reference voltage 130. The purpose of the FWR 104 is to assure that input signal peaks of either polarity will be detected by the comparator 107. When the magnitude of the rectified signal peaks appearing at 105 are below the magnitude of the reference voltage at 106, the comparator output at 108 remains at a logic low level. For whatever duration a signal peak exceeds the reference magnitude, i.e., rises above the threshold, the comparator output at 108 goes to a logic high level.

Figure 4A:
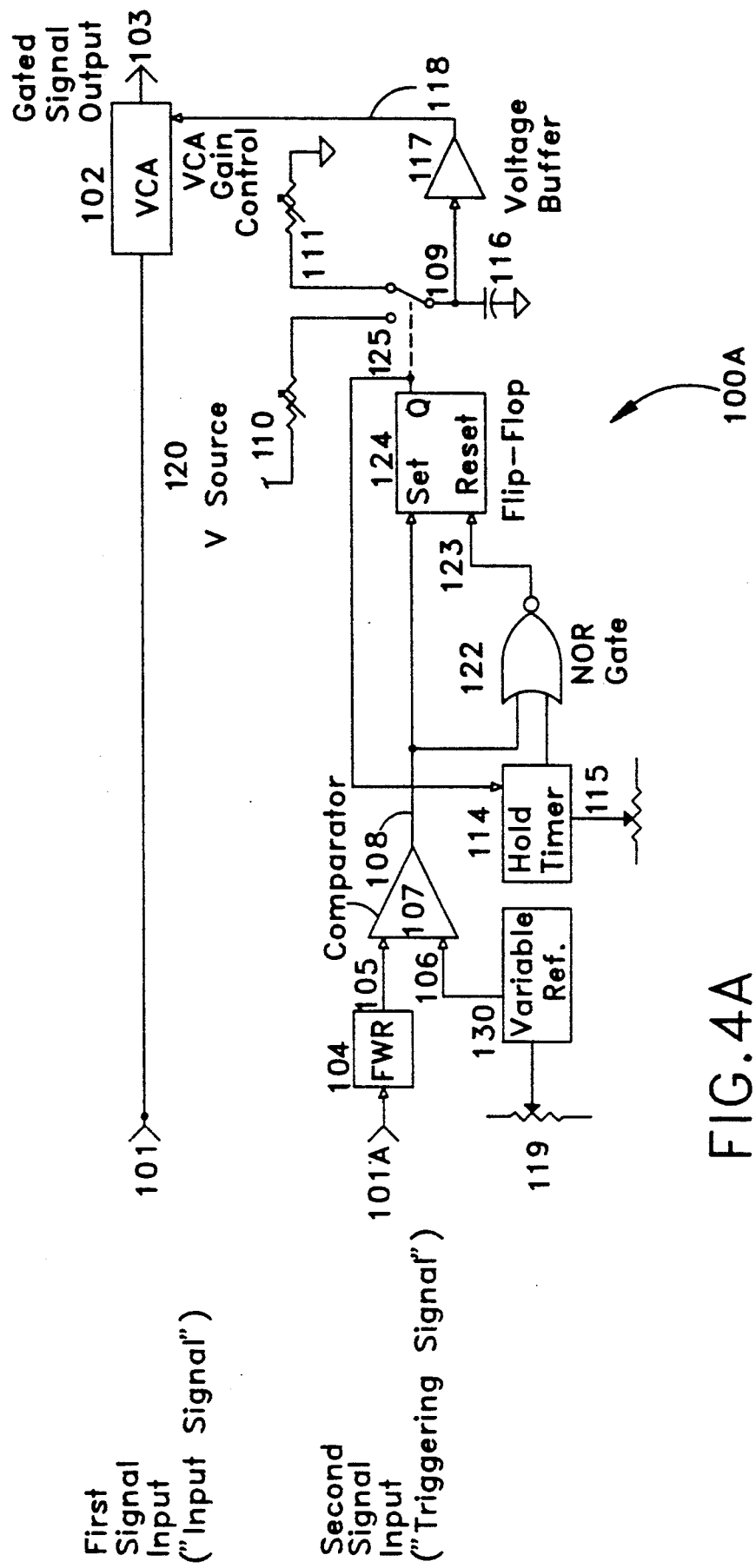
FIG. 4A is a functional block diagram of an alternative embodiment of the present invention noise gate.

It is noted that it is within the scope of the present invention to use a second "external" input signal 101A as a "triggering signal" to be fed to the comparator, as shown in FIG. 4A. Therefore, in the following description, the signal fed to the FWR is either the same as the first input signal fed to the VCA, or a second triggering signal which may be related or unrelated to the first input signal.

When the signal fed to comparator 107 rises above threshold, comparator 107 produces a logical high output which "sets" the flip-flop 124, causing the "Q" output at 125 to switch to a logic high state. The hold timer 114 is coupled to the "Q" output and begins its hold time-out period upon the rising edge of the "Q" signal. The "Q" output also drives the switch 109, which remains in the "attack" position if "Q" is logic high, and goes to the "release" position if "Q" is logic low. Capacitor 116 either charges or discharges. Therefore, as long as the flip-flop 124 is "set", the gate remains in the "attack" state and the voltage on the capacitor 116 will rise up to the voltage source magnitude of 120 and thereafter remain constant.

The output of the NOR gate 122 is coupled to the flip-flop reset input. Whenever the output of 122 goes to logic high, the flip-flop 124 will reset to a logic low "Q" at 125. Therefore, when the flip-flop is reset, the gate goes into the "release" condition, and as long as "Q" remains at logic low, the voltage on the capacitor 116 will fall to zero and remain zero thereafter. As capacitor 116 discharges, the VCA increasingly attenuates the input signal until the attenuation reaches a maximum value. When the attenuation of the VCA reaches maximum, the signal is gated off.

The two inputs of the NOR gate 122 must both be low to produce a logic high at the output. The first NOR input is coupled to the hold timer 114. While the hold timer 114 is timing out, its output is at a logic high state. Therefore, during the hold time-out, the NOR output is forced to a logic low regardless of the other NOR input. The second NOR input is coupled to the comparator output 108. The comparator output 108 is at logic high while the input signal at 101 remains above threshold, and at other times goes to logic low. Therefore, the NOR gate can output a logic high only after the hold time-out has finished and when the input signal at 101 is also below threshold.

The voltage buffer 117 has a very high input impedance and thereby isolates capacitor 116 from the loading of the VCA control input 118, making the voltage on the capacitor 116 solely dependent upon the attack-/release and hold functions. These functions operate as follows. When the signal fed to comparator 107 achieves a great enough magnitude to go above threshold, comparator 107 cause flip-flop 124 to set, which in turn causes switch 109 to move to the attack position, thus contacting resistor 110 and disconnecting resistor 111 (at the same time, the hold timer 114 has also been activated). As long as the hold time remains activated or the signal fed to comparator 107 remains above threshold, the capacitor 116 will charge towards the voltage supply 120 at a rate determined by the resistor-capacitor (RC) time constant of resistor 110 and capacitor 116. This is usually adjustable from about 5 microseconds to about 100 milliseconds. As capacitor 116 charges, the gain of the VCA 102 rises toward unity. When the voltage on 116 equals the voltage of the voltage source 120, the gain of the VCA 102 will equal unity, and the signal at the output 103 is then gated on.

The result of this logical operation is that, if the hold time is set to a longer period than the attack time, then even the shortest transient of the input signal at 101 can fully trigger the gate to 0 dB attenuation regardless of how long the attack time is set. This is illustrated in FIG. 5, and can be compared to FIG. 3 which illustrates the equivalent response of a prior art noise gate.

Referring to FIG. 5, if the hold time is set for any period longer than the attack time, then the hold time remaining after the attack is completed will serve the normal hold time function to the noise gate. FIG. 5 illustrates the following sequence of events as they relate to the circuit of FIG. 4. The input signal 101 goes above threshold TH at time Ta and thus setting the flip-flop 124 and simultaneously triggering the start of the hold timer 114. Even after the input signal 101 falls below threshold TH at time Tb, the hold timer continues its time-out until time Tc. The flip-flop therefore remains set and the VCA gain G keeps ramping up to 0 dB gain at the attack rate, and remains at 0 dB gain until the flip-flop 124 is reset. At time Tc, the input signal 101 is below threshold TH, and the hold timer times out, to thereby cause the NOR gate 122 to force the flip-flop 124 to reset. When the flip-flop 124 resets at time Tc, the noise gate 100 reverts to the "release" condition and the VCA gain G ramps down to full attenuation at the release rate. The VCA 102 then remains fully attenuated until the input signal 101 again rises above threshold TH.

Figure 3:
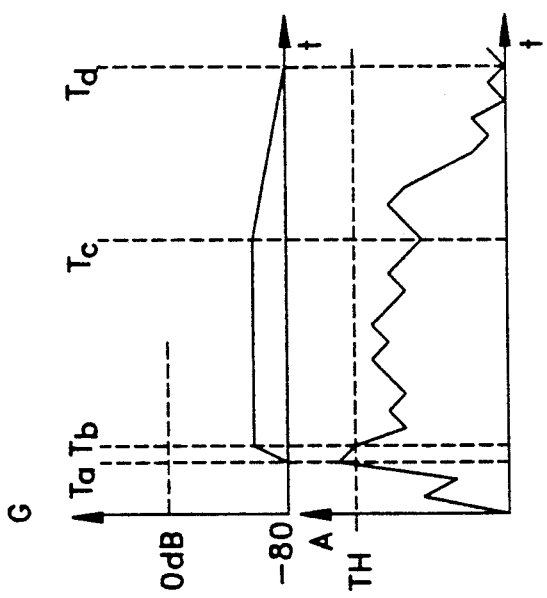
FIG. 3 is an illustrative diagram showing the limitation of prior art noise gates where a brief input signal rising above the threshold is not gated on, and the hold time provides no help since it only starts at time Tb when the input signal falls below the threshold.
Figure 2:
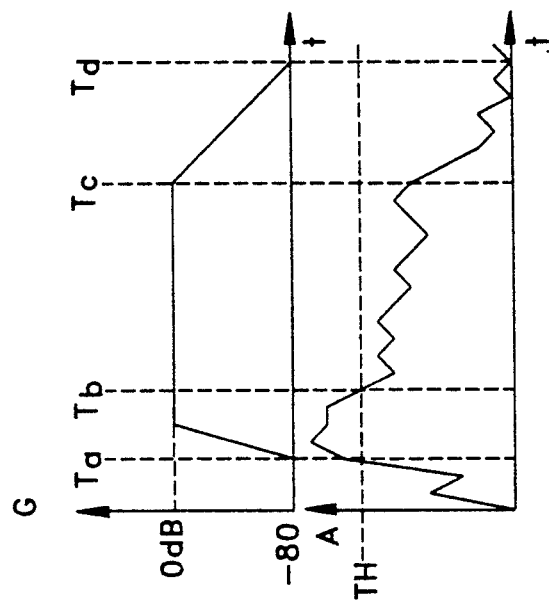
FIG. 2 is an illustrative diagram showing the function of a prior art noise gate which utilizes hold time function, where the hold time function is initiated at time Tb when the input signal falls below the threshold.
Figure 1:
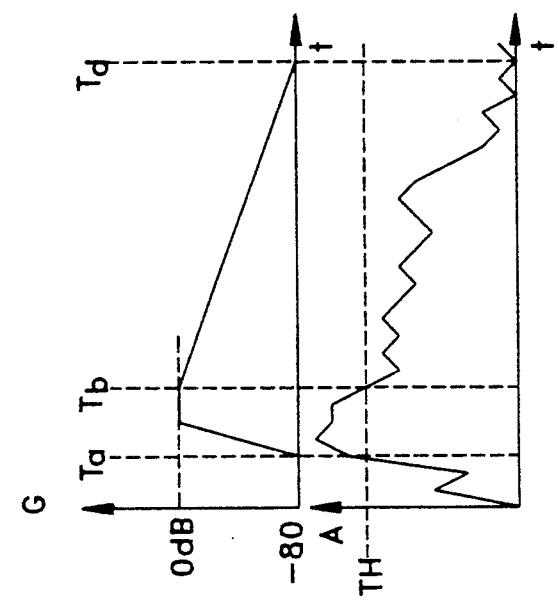
FIG. 1 is an illustrative diagram showing the function of a prior art noise gate which has no hold time function.

Comparing FIGS. 3 and 5, which show responses to the same input signal, it is clear how the present invention improves the trigger reliability of a noise gate with regard to a very brief input signal. As shown in FIG. 3, in prior art noise gates the attack condition is defined solely by the input or triggering signal remaining above the threshold, and a brief signal never gets through the gate. In contrast, as shown in FIG. 5, in the present invention noise gate the attack condition is defined by a bistable logic element combined with a timer, and even the shortest signal can get past the gate. Using the present invention, the input waveshape and duration of time above threshold are far less relevant to the reliability of the gating action using the present invention.

Figure 6:
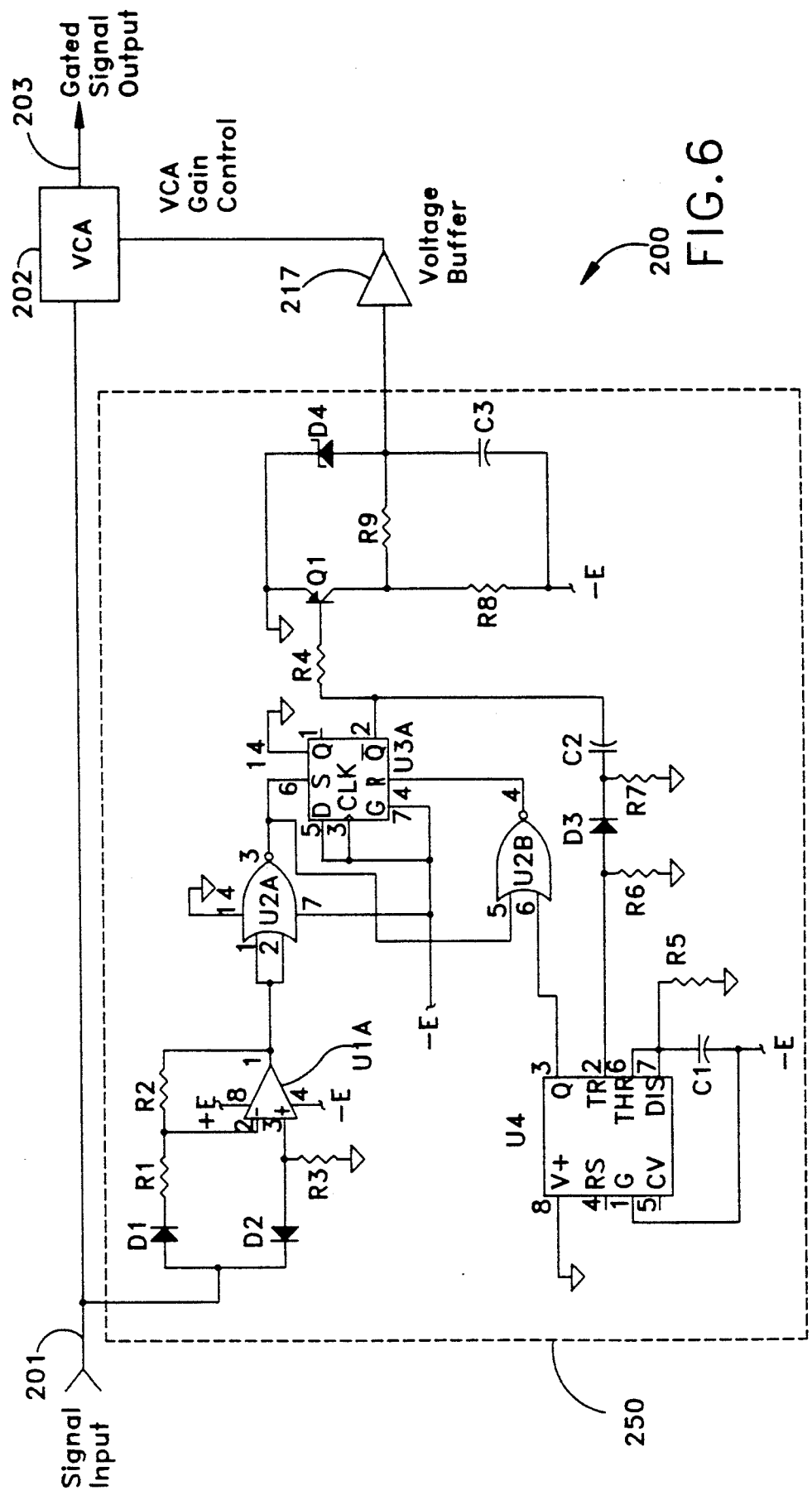
FIG. 6 is a circuitry diagram illustrating one of the embodiments of the present invention noise gate.

Referring to FIG. 6, there is shown a practical implementation of the present invention. The circuit of FIG. 6 is a simplified embodiment of the present invention for a clear demonstration. It is noted that many other circuits can be devised to function according to the present invention.

It is also noted that any suitable VCA can be used within the present invention noise gate. The dotted portion 250 of the circuit 200 shown in FIG. 6 is designed to produce an output of 0 volts when gated "on" and −10 volts when gated "off", to match a VCA that requires a gain control voltage of 0 to −10 volts representing a gain range of 0 to −100 dB, respectively. Of course the dotted portion 250 can be modified to adapt to any particular requirement of a VCA used in the overall noise gate circuit.

It is further noted that the circuit 200 shown in FIG. 6 names some of the integrated circuits (IC) as "A" and "B" parts. This indicates there are more than one functional part per package, such as a dual operational amplifier (opamp), or a quad gate. The functional parts may be swapped without affecting the operation of the circuit, or suitable equivalent parts can be substituted for the parts specified. By way of example only, U1 is an industry standard type LM353 dual opamp, U2 is an industry standard type 4001B quad CMOS NOR gate, U3 is an industry standard type 4013 CMOS dual type D flip-flop, U4 is an industry standard type LM555CN timer, and Q1 is an industry standard type 2N3906 PNP transistor.

The circuit 200 of FIG. 6 operates as follows. An input signal 201 is fed into both the VCA 202 and a FWR. The FWR comprise diodes D1 and D2, resistors R1, R2 and R3, and amplifier U1A, and outputs at pin 1 of amplifier U1A a negative-going rectified signal. The NOR gate U2A has both inputs tied together to act as a lever detector, and receives the output of the FWR from amplifier U1A. By way of example only, resistors R1, R2 and R3 are 10 KΩ resistors. The power supply to pin 8 of amplifier U1A is a positive direct current (DC) voltage source +E, while pin 4 of the amplifier U1A is connected to a negative DC voltage source −E. By way of example only, positive DC voltage source +E is 15 V and negative DC voltage source −E is −15 V.

The power supply to the VCC pins of U2, U3 and U4, namely pin 14 of NOR gate U2A, pin 14 of flip-flop U3A, and pin 8 of hold time IC U4 are returned to ground (zero volts), while the VEE pins of U2, U3 and U4, namely pin 7 of NOR gate U2A, pins 7, 3 and 5 of flip-flop U3A, and pin 1 of hold time IC U4 are returned to the negative DC voltage source −E.

The voltage at the output of amplifier U1A rests at zero volts with no input signal, giving the input of NOR gate U2A the equivalent of a logic high. This forces the output of U2A to remain at a logic low of −15 V. When the output of FWR is of a great enough amplitude, i.e., greater than about −10 V, the output of NOR gate U2A changes state to a logic high, or about zero volts. Thus, the NOR gate U2A acts as the comparator, but with effectively a fixed reference voltage. The output of NOR gate U2A is coupled to the SET input pin of the flip-flop U3A, and one input of the NOR gate U2B. When the level detector of NOR gate U2A switches to a logic high, i.e., when the input signal goes above threshold, the flip-flop U3A is set to high (i.e., output Q is high but output Bar-Q is low).

It is noted that the Q and Bar-Q outputs of flip-flop U3A are always at opposite logic states, and can be used interchangeably as needed to supply the correct logic polarity to the other circuit elements without violating the teachings of FIG. 4 which shows only the Bar-Q output being used.

The Bar-Q output of flip-flop U3A is coupled, through resistor R4, to a logic invertor transistor Q1, which also serves as a high current switch. By way of example only, resistor R4 is 10 KΩ. The collector resistor R8 is returned to the negative −E supply. By way of example only, resistor R8 is 500 KΩ. When the flip-flop U3A is set, and Bar-Q is low, the voltage at the collector of transistor Q1 almost instantly rises to nearly 0 V. Resistor R9, acting as a current limiter, couples the timing capacitor C3 to the collector of transistor Q1. By way of example only, resistor R9 is 5 KΩ and capacitor C3 is 0.1 μF. The voltage on capacitor C3 will rise to the collector voltage of transistor Q1 at the attack rate determined by the RC time constant of resistor R9 and capacitor C3, and remain steady until the flip-flop U3A is reset and the Q output is low. In this case the attack time is about 1 millisecond. It is noted that resistor R9 may be a variable resistor, giving an adjustable attack time. In any event, the charging of capacitor C3 results in high VCA gain, and the signal is gated on.

When flip-flop U3A is reset and Bar-Q output goes high, the collector current of transistor Q1 is sut off and the capacitor C3 will begin to discharge through resistor R9 in series with resistor R8 towards the −E voltage supply. The RC time constant of resistors R9 and R8 and capacitor C3 determine the "release" time of the noise gate which in this case is about 200 milliseconds. It is noted that resistor R8 may be a variable resistor, giving an adjustable release time. As the capacitor C3 discharges, the diode D4 avalanches and clamps the voltage at a negative voltage level. Otherwise, diode D4 presents a high impedance and has no effect upon the circuit. By way of example only, diode D4 is a 10 V zener diode. The voltage at the junction of capacitor C3, diode D4, and resistor R9 is the final control output which is sent to VCA 202. The control voltage output is received by VCA 202 through a high impedance voltage buffer 217 to prevent any loading or leakage currents from affecting the charge on capacitor C3.

The flip-flop U3A is reset by a logic high pulse generated by the NOR gate U2B. The output of U2B can only go high when both of its NOR inputs go low or one NOR input is already low and the other then drops low. A logic high pulse to reset the flip-flop U3A is generated in the following manner.

The hold timer is comprised of monostable timer IC chip U4, capacitor C1 and resistor R5. This monostable timer U4 is triggered by the negative going edge of a pulse appearing at the TR terminal (i.e., pin 2). A pulse generator circuit comprised of diode D3, resistors R6 and R7, and capacitor C2 is coupled to the TR input of the timer U4. By way of example only, resistors R6 and R7 are 10 KΩ resistors, and capacitor C2 is 0.001 μF. The pulse generator receives the Bar-Q output of the flip-flop U3A, which is a rectangular logic waveform. Capacitor C2 and resistor R7 act as a differentiator to the Bar-Q waveform and converts the Bar-Q logic transitions to narrow spikes. Diode D3 is biased by resistor R6 to allow only the negative spikes of the differentiated signal to reach the TR input of timer U4. In this manner, the timer U4 will be triggered at each instance of Bar-Q output going to logic low, i.e., whenever the flip-flop U3A becomes "set".

When the hold timer U4 is triggered, the Q output of timer U4 goes high for a specific period of time which is determined by the RC time constant of capacitor C1 and resistor R5. By way of example only, resistor R5 is 50 KΩ and capacitor C1 is 4.7 μF. In the present case this produces a hold time of about 200 milliseconds. It is noted that resistor R5 may be a variable resistor to provide an adjustable hold time.

The Q output of hold timer at pin 3 of timer U4 is connected as one of the inputs at pin 6 of the NOR gate U2B. The other input at pin 5 of NOR gate U2B is taken from the NOR gate comparator U2A at pin 3. The reset output of NOR gate U2B cannot go to logic high and reset the flip-flop U3A as long as either the hold timer U4 remains in its hold time period with a logic high output or the input signal is above threshold which produces a logic high at the comparator output. After the hold timer finishes its triggered time-out, the Q output at pin 3 of timer U4 drops to logic low. At that instant, if the comparator output at pin 3 of NOR gate U2A is already low (as a result of the input signal falling below the threshold), then a logic high will be produced by the NOR gate U2B output, which in turn will reset the flip-flop U3A; or if the comparator output at pin 3 of NOR gate U2A is not yet low, then at the next instance when the comparator output at pin 3 of NOR gate U2A drops low, a reset pulse will be produced by NOR gate U2B. Once the flip-flop U3A has been reset, the noise gate remains in the release condition until the input signal again triggers the comparator U2A and starts the attack-hold-release sequence all over again.

Figure 6A:
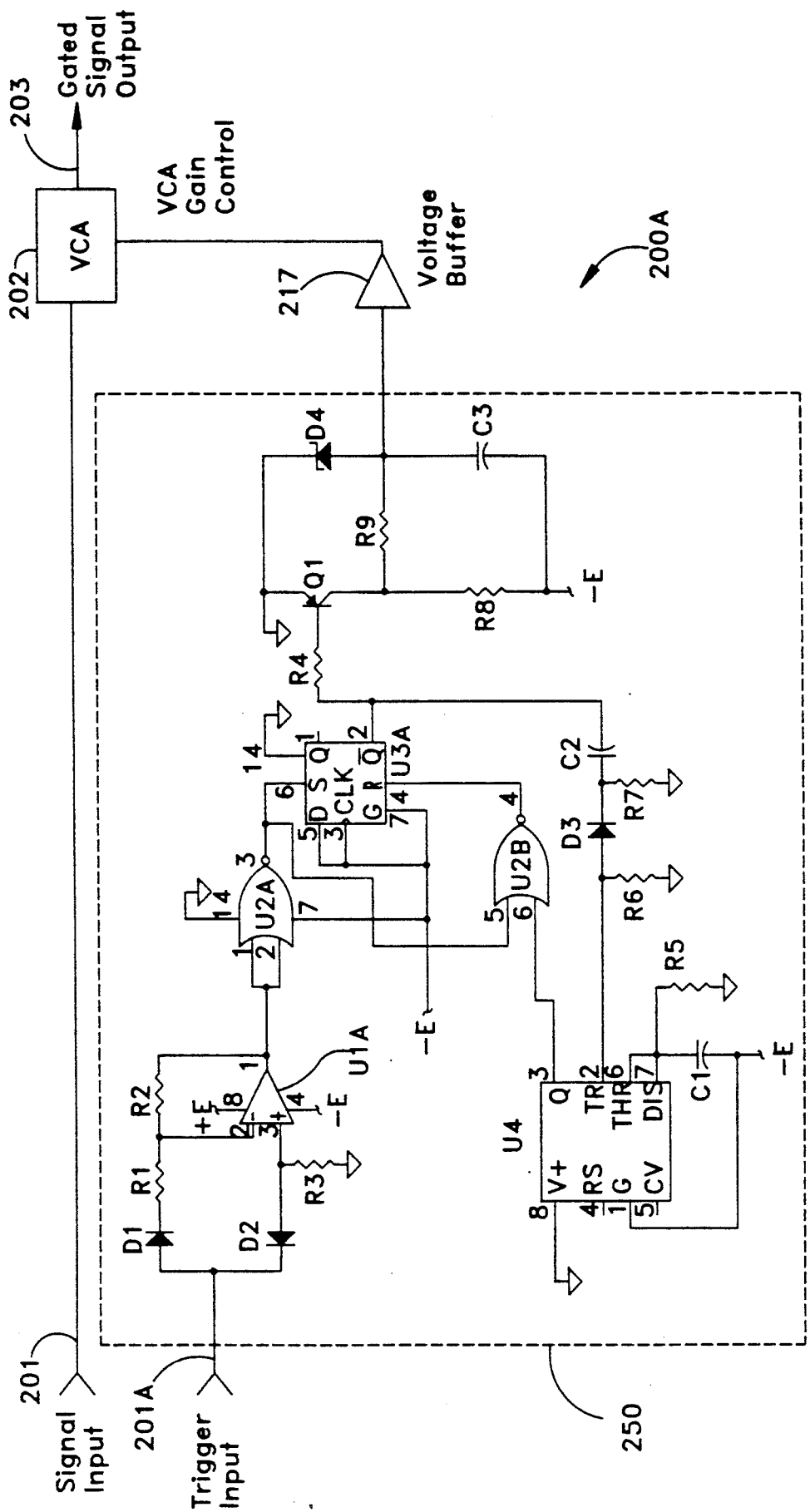
FIG. 6A is a circuitry diagram illustrating an alternative one of the embodiments of the present invention noise gate.

As previously stated, it is within the scope of the present invention to use a second "external" input signal as a "triggering signal" to be fed to the comparator. Referring to FIG. 6A, there is shown an alternative embodiment of the present invention. Circuit 200A shown in FIG. 6A is almost identical to circuit 200 shown in FIG. 6, except that in circuit 200A a separate triggering signal 200A is fed to the FWR and comparator circuit.

The present invention has many advantages. It overcomes the prior art disadvantage wherein there is a lack of gaining complete attack on brief input signals, while still avoiding the problem of chatter. It also eliminates the rectifier filter without causing the undesirable single-cycle gating action of prior art noise gates, so that the appreciable time delay and the loss of transients caused by the prior art rectifier filter are eliminated. In addition, it is durable, reliable, energy efficient and inexpensive to produce. Furthermore, it is not limited to the applications in audio and music recording, but can be used in telecommunications or other fields.

Defined in detail, the present invention is a logic enhanced noise gate, comprising: (a) a voltage controlled amplifier (VCA) coupled to an input signal and having an output signal, where the amplitude of the output signal is controlled by the VCA in response to a VCA gain control signal generated by a VCA gain control circuit; (b) the VCA gain control circuit including a comparator, a flip-flop element, a timer, a logical NOR gate and a VCA gain control signal generator; (c) the comparator receiving a sample of the input signal or a triggering signal for detecting whether it is above a threshold level; (d) the flip-flop element coupled to the comparator and residing at a first logical state or a second logical state; (e) the flip-flop element being set by the comparator to the first logic state whenever the input or triggering signal rises above the threshold level; (f) the timer coupled to the flip-flop element for starting a hold time period whenever the flip-flop element becomes set to the first logical state; (g) the logical NOR gate with inputs coupled to the timer and the comparator for outputting a reset signal to the flip-flop element to reset the flip-flop element to its second logical state when the hold time period has expired and the input or triggering signal is below the threshold level; (h) the VCA gain control signal generator coupled to the flip-flop element for producing the VCA gain control signal depending on whether the flip-flop element is in the first logical state or the second logical state; (i) the VCA gain control signal causing the VCA to go to a higher gain when the flip-flop element resides in the first logical state; and (j) the VCA gain control signal causing the VCA to go to a lower gain when the flip-flop element resides in the second logical state; (k) whereby the logic enhanced noise gate is gated on when the VCA has a higher gain, and off when the VCA has a lower gain, and can respond to input or triggering signals arising above the threshold level for a very short period of time, because the flip-flop element combined with the timer sustain an attack period from the instant the output of the comparator is at a logic high until both the hold time period expires and the output of the comparator is at a logic low.

Defined broadly, the present invention is a voltage gain control circuit for a noise gate which includes a voltage controlled amplifier (VCA) coupled to a triggering signal and having an output signal, where the amplitude of the output signal is controlled by the VCA in response to a voltage gain control signal, the voltage gain control circuit comprising: (a) a level detecting element receiving a sample of the triggering signal for detecting whether it is above a threshold level; (b) a bistable logical element coupled to the level detecting element and residing at a first logical state or a second logical state; (c) the bistable logical element being set by the level detecting element to the first logic state whenever the triggering signal rises above the threshold level; (d) a timing element coupled to the bistable logical element for starting a hold time period whenever the bistable logical element becomes set to the first logical state; (f) a monostable logical element with inputs coupled to the timing element and the level detecting element for outputing a reset signal to the bistable logical element to reset the bistable logical element to its second logical state when the hold time period has expired and the triggering signal is below the threshold level; (g) a control signal generating element coupled to the bistable logical element for producing the voltage gain control signal depending on whether the bistable logical element is in the first logical state or the second logical state; (h) the voltage gain control signal causing the VCA to go to a higher gain when the bistable logical element resides in the first logical state; and (i) the voltage gain control signal causing the VCA to go to a lower gain when the bistable logical element resides in the second logical state; (j) whereby the noise gate is gated on when the VCA has a higher gain, and off when the VCA has a lower gain, and can respond to triggering signals arising above the threshold level for a very short period of time, because the bistable logical element combined with the timing element sustain an attack period from the instant the triggering signal goes above the threshold level until both the hold time period expires and the triggering signal falls below the threshold level.

Defined more broadly, the present invention is a logical array for a noise gate which includes means for detecting whether a triggering signal is above a threshold level and means for timing a hold time period during which the noise gate is on, the logical array comprising: (a) a bistable logical element coupled to the detecting means and residing at a first logical state or a second logical state; (b) the bistable logical element being set by the detecting means to the first logic state whenever the triggering signal rises above the threshold level; (c) the bistable logical element triggering the timing means to start the hold time period whenever the bistable logical element becomes set to the first logical state; and (d) a monostable logical element with inputs coupled to the timing means and the detecting means for outputing a reset signal to the bistable logical element to reset the bistable logical element to its second logical state when the hold time period has expired and the triggering signal is below the threshold level; (e) whereby the noise gate can respond to triggering signals arising above the threshold level for a very short period of time, because the bistable logical element sustains an attack period from the instant the triggering signal goes above the threshold level until both the hold time period expires and the triggering signal falls below the threshold level.

Defined alternatively, the present invention is a method for enhancing the performance of a noise gate which includes a voltage controlled amplifier (VCA) coupled to an input or triggering signal and having an output signal, where the amplitude of the output signal is controlled by the VCA, the method comprising the steps of: (a) detecting whether the triggering signal is above a threshold level; (b) setting a bistable logical element to a first logic state whenever the triggering signal rises above the threshold level; (c) starting a hold time period whenever the bistable logical element becomes set to the first logical state; (d) setting the bistable logical element to a second logical state when the hold time period has expired and the triggering signal is below the threshold level; and (e) causing the VCA to go to a higher gain when the bistable logical element resides in the first logical state, or a lower gain when the bistable logical element resides the in second logical state; (f) whereby the noise gate is gated on when the VCA has a higher gain, and off when the VCA has a lower gain, and can respond to triggering signals arising above the threshold level for a very short period of time, because the bistable logical element sustains an attack period from the instant the triggering signal goes above the threshold level until both the hold time period expires and the triggering signal falls below the threshold level.

Defined even more broadly, the present invention is a method for enhancing the performance of a noise gate which allows a signal to pass when it is on or blocks the signal when it is off, the noise gate having the function of detecting whether a triggering signal is above a threshold level and timing a hold time period during which the noise gate is on, the method comprising the steps of: (a) starting the hold time period whenever the triggering signal rises above the threshold level; and (b)

causing the noise gate to go off when the hold time period has expired and the triggering signal is below the threshold level; (c) whereby the noise gate can respond to triggering signals arising above the threshold level for a very short period of time, because an attack period is sustained from the instant the triggering signal goes above the threshold level until both the hold time period expires and the triggering signal falls below the threshold level.

Of course the present invention is not intended to be restricted to any particular form or arrangement, or any specific embodiment disclosed herein, or any specific use, since the same may be modified in various particulars or relations without departing from the spirit or scope of the claimed invention hereinabove shown and described of which the apparatus shown is intended only for illustration and for disclosure of an operative embodiment and not to show all of the various forms or modifications in which the present invention might be embodied or operated.

The present invention has been described in considerable detail in order to comply with the patent laws by providing full public disclosure of at least one of its forms. However, such detailed description is not intended in any way to limit the broad features or principles of the present invention, or the scope of patent monopoly to be granted.

What is claimed is:

1. A voltage gain control circuit for a noise gate which includes a voltage controlled amplifier (VCA) coupled to an input signal and having an output signal, where the amplitude of the output signal is controlled by the VCA in response to a voltage gain control signal, the voltage gain control circuit comprising:
   a. a level detecting element receiving a triggering signal for detecting whether it is above a threshold level;
   b. a bistable logical element coupled to said level detecting element and residing at a first logical state or a second logical state;
   c. said bistable logical element being set by said level detecting element to said first logic state whenever said triggering signal rises above said threshold level;
   d. a timing element coupled to said bistable logical element for starting a hold time period whenever said bistable logical element becomes set to said first logical state;
   f. a logical element with inputs coupled to said timing element and said level detecting element for outputting a reset signal to said bistable logical element to reset said bistable logical element to its second logical state when said hold time period has expired and said triggering signal is below said threshold level;
   g. a control signal generating element coupled to said bistable logical element for producing said voltage gain control signal depending on whether said bistable logical element is in said first logical state or said second logical state;
   h. said voltage gain control signal causing said VCA to go to a higher gain when said bistable logical element resides in said first logical state; and
   i. said voltage gain control signal causing said VCA to go to a lower gain when said bistable logical element resides in said second logical state;
   j. whereby said noise gate is gated on when said VCA has a higher gain, and off when said VCA has a lower gain, and can respond to triggering signals arising above said threshold level for a very short period of time, because said bistable logical element combined with said timing element sustain an attack period from the instant said triggering signal goes above said threshold level until both said hold time period expires and said triggering signal falls below said threshold level.

2. The invention as defined in claim 1 further comprising a full wave rectifying element coupled to said level detecting element for assuring that triggering signals of either polarity will be detected by said level detecting element.

3. The invention as defined in claim 1 further comprising a variable voltage referencing element coupled to said level detecting element for determining said threshold level.

4. The invention as defined in claim 1 further comprising a pulse generating element coupled between said bistable logical element and said timing element for sending a pulse signal to trigger said timing element when said bistable logical element is set to said first logical state.

5. The invention as defined in claim 1 further comprising a voltage buffering element coupled between said control signal generating element and said VCA for buffering said control signal generating element from said VCA to ensure that said signal generating element solely responds to said bistable logical element.

6. A logic enhanced noise gate, comprising:
   a. a voltage controlled amplifier (VCA) coupled to an input signal and having an output signal, where the amplitude of the output signal is controlled by the VCA in response to a VCA gain control signal generated by a VCA gain control circuit;
   b. said VCA gain control circuit including a comparator, a flip-flop element, a timer, a logical NOR gate and a VCA gain control signal generator;
   c. said comparator receiving a sample of said input signal for detecting whether it is above a threshold level;
   d. said flip-flop element coupled to said comparator and residing at a first logical state or a second logical state;
   e. said flip-flop element being set by said comparator to said first logic state whenever said input signal rises above said threshold level;
   f. said timer coupled to said flip-flop element for starting a hold time period whenever said flip-flop element becomes set to said first logical state;
   g. said logical NOR gate with inputs coupled to said timer and said comparator for outputting a reset signal to said flip-flop element to reset said flip-flop element to its second logical state when said hold time period has expired and said input signal is below said threshold level;
   h. said VCA gain control signal generator coupled to said flip-flop element for producing said VCA gain control signal depending on whether said flip-flop element is in said first logical state or said second logical state;
   i. said VCA gain control signal causing said VCA to go to a higher gain when said flip-flop element resides in said first logical state; and
   j. said VCA gain control signal causing said VCA to go to a lower gain when said flip-flop element resides in said second logical state;

k. whereby said logic enhanced noise gate is gated on when said VCA has a higher gain, and off when said VCA has a lower gain, and can respond to input signals arising above said threshold level for a very short period of time, because said flip-flop element combined with said timer sustain an attack period from the instant the output of said comparator is at a logic high until both said hold time period expires and the output of said comparator is at a logic low.

7. The invention as defined in claim 6 further comprising a full wave rectifier (FWR) coupled to said comparator for assuring that input signals of either polarity will be detected by said comparator.

8. The invention as defined in claim 6 further comprising a variable voltage reference source coupled to said comparator for determining said threshold level.

9. The invention as defined in claim 6 further comprising a pulse generator coupled between said flip-flop element and said timer for sending a pulse signal to trigger said timer when said flip-flop element is set to said first logical state.

10. The invention as defined in claim 6 further comprising a voltage buffer coupled between said VCA gain control signal generator and said VCA for buffering said VCA gain control signal generator from said VCA to ensure that said VCA gain control signal generator solely responds to said flip-flop element.

11. A logic enhanced noise gate, comprising:
   a. a voltage controlled amplifier (VCA) coupled to an input signal and having an output signal, where the amplitude of the output signal is controlled by the VCA in response to a VCA gain control signal generated by a VCA gain control circuit;
   b. said VCA gain control circuit including a comparator, a flip-flop element, a timer, a logical NOR gate and a VCA gain control signal generator;
   c. said comparator receiving a triggering signal for detecting whether it is above a threshold level;
   d. said flip-flop element coupled to said comparator and residing at a first logical state or a second logical state;
   e. said flip-flop element being set by said comparator to said first logic state whenever said triggering signal rises above said threshold level;
   f. said timer coupled to said flip-flop element for starting a hold time period whenever said flip-flop element becomes set to said first logical state;
   g. said logical NOR gate with inputs coupled to said timer and said comparator for outputting a reset signal to said flip-flop element to reset said flip-flop element to its second logical state when said hold time period has expired and said triggering signal is below said threshold level;
   h. said VCA gain control signal generator coupled to said flip-flop element for producing said VCA gain control signal depending on whether said flip-flop element is in said first logical state or said second logical state;
   i. said VCA gain control signal causing said VCA to go to a higher gain when said flip-flop element resides in said first logical state; and
   j. said VCA gain control signal causing said VCA to go to a lower gain when said flip-flop element resides in said second logical state;
   k. whereby said logic enhanced noise gate is gated on when said VCA has a higher gain, and off when said VCA has a lower gain, and can respond to triggering signals arising above said threshold level for a very short period of time, because said flip-flop element combined with said timer sustain an attack period from the instant the output of said comparator is at a logic high until both said hold time period expires and the output of said comparator is at a logic low.

12. The invention as defined in claim 11 further comprising a full wave rectifier (FWR) coupled to said comparator for assuring that triggering signals of either polarity will be detected by said comparator.

13. The invention as defined in claim 11 further comprising a variable voltage reference source coupled to said comparator for determining said threshold level.

14. The invention as defined in claim 11 further comprising a pulse generator coupled between said flip-flop element and said timer for sending a pulse signal to trigger said timer when said flip-flop element is set to said first logical state.

15. The invention as defined in claim 11 further comprising a voltage buffer coupled between said VCA gain control signal generator and said VCA for buffering said VCA gain control signal generator from said VCA to ensure that said VCA gain control signal generator solely responds to said flip-flop element.

16. A logical array for a noise gate which includes means for detecting whether a triggering signal is above a threshold level and means for timing a hold time period during which the noise gate is on, the logical array comprising:
   a. a bistable logical element coupled to said detecting means and residing at a first logical state or a second logical state;
   b. said bistable logical element being set by said detecting means to said first logic state whenever said triggering signal rises above said threshold level;
   c. said bistable logical element triggering said timing means to start said hold time period whenever said bistable logical element becomes set to said first logical state;
   d. a logical element with inputs coupled to said timing means and said detecting means for outputting a reset signal to said bistable logical element to reset said bistable logical element to its second logical state when said hold time period has expired and said triggering signal is below said threshold level; and
   e. when said triggering signal arises above said threshold level for a very short period of time, said bistable logical element sustains an attack period from the instant said triggering signal goes above said threshold level until both said hold time period expires and said triggering signal falls below said threshold level.

17. The invention as defined in claim 16 further comprising a full wave rectifying means coupled to said detecting means for assuring that triggering signals of either polarity will be detected by said detecting means.

18. The invention as defined in claim 16 further comprising a voltage referencing means coupled to said detecting means for determining said threshold level.

19. The invention as defined in claim 16 further comprising a pulse generating means coupled between said bistable logical element and said timing means for sending a pulse to trigger said timing means when said bistable logical element is set to said first logical state.

20. The invention as defined in claim 16 further comprising a control signal generating means coupled to said bistable logical element for producing a voltage gain control signal to a voltage controlled amplifier (VCA) coupled to a triggering signal and also coupled to the control signal generating means for providing an output signal, where said voltage gain control signal causes said VCA to go to a higher gain when said bistable logical element resides in said first logical state and a lower gain when in said second logical state.

21. The invention as defined in claim 20, further comprising a voltage buffering means coupled between said control signal generating means and said VCA for buffering said control signal generating means from said VCA to ensure that said signal generating means solely responds to said bistable logical element.

22. A method for enhancing the performance of a noise gate which includes a voltage controlled amplifier (VCA) coupled to an input signal and having an output signal, where the amplitude of the output signal is controlled by the VCA, the method comprising the steps of:
   a. detecting whether said input signal is above a threshold level;
   b. setting a bistable logical element to a first logic state whenever said input signal rises above said threshold level;
   c. starting a hold time period whenever said bistable logical element becomes set to said first logical state;
   d. setting said bistable logical element to a second logical state when said hold time period has expired and said input signal is below said threshold level; and
   e. causing said VCA to go to a higher gain when said bistable logical element resides in said first logical state, or a lower gain when said bistable logical element resides said in second logical state;
   f. whereby said noise gate is gated on when said VCA has a higher gain, and off when said VCA has a lower gain, and can respond to input signals arising above said threshold level for a very short period of time, because said bistable logical element sustains an attack period from the instant said input signal goes above said threshold level until both said hold time period expires and said input signal falls below said threshold level.

23. The invention as defined in claim 22, further comprising the step of providing a logical element for resetting said bistable logical element to its second logical state when said hold time period has expired and said input signal is below said threshold level.

24. A method for enhancing the performance of a noise gate which includes a voltage controlled amplifier (VCA) coupled to an input signal and having an output signal, where the amplitude of the output signal is controlled by the VCA, the method comprising the steps of:
   a. detecting whether a triggering signal is above a threshold level;
   b. setting a bistable logical element to a first logic state whenever said triggering signal rises above said threshold level;
   c. starting a hold time period whenever said bistable logical element becomes set to said first logical state;
   d. setting said bistable logical element to a second logical state when said hold time period has expired and said triggering signal is below said threshold level; and
   e. causing said VCA to go to a higher gain when said bistable logical element resides in said first logical state, or a lower gain when said bistable logical element resides said in second logical state;
   f. whereby said noise gate is gated on when said VCA has a higher gain, and off when said VCA has a lower gain, and can respond to triggering signals arising above said threshold level for a very short period of time, because said bistable logical element sustains an attack period from the instant said triggering signal goes above said threshold level until both said hold time period expires and said triggering signal falls below said threshold level.

25. The invention as defined in claim 24, further comprising the step of providing a logical element for resetting said bistable logical element to its second logical state when said hold time period has expired and said triggering signal is below said threshold level.

* * * * *